(12) United States Patent
Liu et al.

(10) Patent No.: US 10,827,648 B2
(45) Date of Patent: *Nov. 3, 2020

(54) CABINET LIQUID COOLING SYSTEM AND CABINET

(71) Applicant: Huawei Technologies Co., Ltd., Shenzhen (CN)

(72) Inventors: Lianjun Liu, Shenzhen (CN); Yao Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 123 days.

This patent is subject to a terminal disclaimer.

(21) Appl. No.: 16/241,088

(22) Filed: Jan. 7, 2019

(65) Prior Publication Data

US 2019/0208667 A1 Jul. 4, 2019

Related U.S. Application Data

(63) Continuation of application No. 14/980,467, filed on Dec. 28, 2015, now Pat. No. 10,178,801, which is a (Continued)

(30) Foreign Application Priority Data

Jul. 24, 2013 (CN) .......................... 2013 1 0313877

(51) Int. Cl.
*H05K 7/20* (2006.01)
*H05K 7/14* (2006.01)
*H05K 7/18* (2006.01)

(52) U.S. Cl.
CPC ....... *H05K 7/20272* (2013.01); *H05K 7/1488* (2013.01); *H05K 7/183* (2013.01);
(Continued)

(58) Field of Classification Search
CPC .. H05K 7/20272; H05K 7/1488; H05K 7/183; H05K 7/20781; H05K 7/2029;
(Continued)

(56) References Cited

U.S. PATENT DOCUMENTS 5,740,018 A 4/1998 Rumbut, Jr.
7,342,789 B2 3/2008 Hall et al.
(Continued)

FOREIGN PATENT DOCUMENTS

CN 1409589 A 4/2003
CN 1809261 A 7/2006
(Continued)

OTHER PUBLICATIONS

Machine Translation and Abstract of Chinese Publication No. CN102695404, Sep. 26, 2012, 17 pages.
(Continued)

*Primary Examiner* — Joel M Attey
(74) *Attorney, Agent, or Firm* — Conley Rose, P.C.

(57) ABSTRACT

A cabinet liquid cooling system is configured to dissipate heat of a cabinet. A flow allocation unit is installed on a single side of the cabinet, is located in space between a side wall of the cabinet and a mounting bar of the cabinet, and is provided with a liquid inlet and a liquid outlet. A liquid cooling system (LCS) control unit is installed at the bottom of the cabinet and cyclically supplies liquid to the flow allocation unit using the liquid inlet and the liquid outlet. A liquid supply branch includes a liquid delivery pipe and a liquid return pipe. A node pipe includes a liquid inlet pipe and a liquid outlet pipe. Both the liquid inlet pipe and the liquid outlet pipe are connected to the corresponding liquid delivery pipe and liquid return pipe using the quick male connector and the quick female connector.

14 Claims, 5 Drawing Sheets

Related U.S. Application Data continuation of application No. PCT/CN2014/081734, filed on Jul. 7, 2014.

(52) U.S. Cl.
CPC ....... *H05K 7/20781* (2013.01); *H05K 7/2029* (2013.01); *H05K 7/20536* (2013.01); *H05K 7/20645* (2013.01); *H05K 7/20709* (2013.01); *H05K 7/20818* (2013.01)

(58) Field of Classification Search
CPC .......... H05K 7/20536; H05K 7/20645; H05K 7/20709; H05K 7/20818
USPC .......................................... 165/80.4, 104.33
See application file for complete search history.

(56) References Cited

U.S. PATENT DOCUMENTS

| | | | |
|---|---|---|---|
| 7,450,385 | B1 | 11/2008 | Campbell et al. |
| 7,466,549 | B2 | 12/2008 | Doerrich et al. |
| 7,614,247 | B2 | 11/2009 | Nicolai et al. |
| 7,635,020 | B2 | 12/2009 | Hartel et al. |
| 8,934,244 | B2 | 1/2015 | Shelnutt et al. |
| 2003/0057546 | A1 | 3/2003 | Memory et al. |
| 2004/0057211 | A1 | 3/2004 | Kondo et al. |
| 2006/0107678 | A1 | 5/2006 | Nicolai et al. |
| 2011/0026225 | A1* | 2/2011 | Ostwald ............. H05K 7/20781 361/699 |
| 2011/0317367 | A1* | 12/2011 | Campbell ............... H05K 7/203 361/700 |
| 2013/0025818 | A1 | 1/2013 | Lyon et al. |
| 2013/0043775 | A1 | 2/2013 | Chen et al. |
| 2014/0240920 | A1 | 8/2014 | Cox et al. |
| 2015/0077930 | A1 | 3/2015 | Kadotani et al. |

FOREIGN PATENT DOCUMENTS

| | | |
|---|---|---|
| CN | 102695404 A | 9/2012 |
| DE | 202004010201 U1 | 9/2004 |
| DE | 202004010204 U1 | 9/2004 |
| JP | 2009105142 A | 5/2009 |
| WO | 03006910 A1 | 1/2003 |

OTHER PUBLICATIONS

Machine Translation and Abstract of German Publication No. DE202004010201, Sep. 16, 2004, 5 pages.
Machine Translation and Abstract of German Publication No. DE202004010204, Sep. 16, 2004, 11 pages.
Machine Translation and Abstract of Japanese Publication No. JP2009105142, May 14, 2009, 27 pages.
Foreign Communication From A Counterpart Application, European Application No. 14829090.1, Extended European Search Report dated Jun. 7, 2016, 9 pages.
Foreign Communication From A Counterpart Application, Chinese Application No. 201310313877.1, Chinese Office Action dated Jun. 28, 2016, 3 pages.
Foreign Communication From A Counterpart Application, Chinese Application No. 201310313877.1, Chinese Search Report dated Jun. 17, 2016, 2 pages.
Foreign Communication From A Counterpart Application, PCT Application No. PCT/CN2014/081734, English Translation of International Search Report dated Sep. 28, 2014, 3 pages.
Foreign Communication From A Counterpart Application, PCT Application No. PCT/CN2014/081734, English Translation of Written Opinion dated Sep. 28, 2014, 6 pages.

\* cited by examiner

CABINET LIQUID COOLING SYSTEM AND CABINET

CROSS-REFERENCE TO RELATED APPLICATIONS

This application is a continuation of U.S. patent application Ser. No. 14/980,467 filed on Dec. 28, 2015, now U.S. Pat. No. 10,178,801, which is a continuation of International Patent Application No. PCT/CN2014/081734 filed on Jul. 7, 2014. The International Patent Application claims priority to Chinese Patent Application No. 201310313877.1 filed on Jul. 24, 2013. All of the afore-mentioned patent applications are hereby incorporated by reference in their entireties.

TECHNICAL FIELD

The present disclosure relates to the field of cabinet heat dissipation technologies, and in particular, to a cabinet liquid cooling system and a cabinet.

BACKGROUND

As use requirements become increasingly strict, heat dissipation of a chip with high power consumption, and energy conservation and emission reduction gradually become a principal contradiction faced by next generation information and communications technology (ICT) convergence. Liquid cooling, as an efficient heat dissipation solution, has been widely applied to fields, such as the defense industry, medical treatment, and mainframe computers. That a liquid cooling technology is introduced into a data center and directly acts on a heat source in a primary device is currently an efficient and feasible heat dissipation solution, and has a broad application prospect.

In a typical liquid cooling system loop of an existing data center, a device cooling system is configured to transfer heat from a central processing unit (CPU), a memory, a power supply, and the like to a heat exchanger, and implement heat exchange with an upper-level cooling system. Even though the device cooling system is closely coupled to a rack and a primary device, pipeline layout occupies internal space of the rack, bringing many difficulties to rack design, device cabling, and installation and maintenance.

In addition, the current data center generally uses an International Electrotechnical Commission (IEC) 600 wide standard rack, and a conventional pipeline layout solution of a device cooling system includes the following two solutions. First, a flow allocation unit is securely installed on the right side of a cabinet, and is located in front of a mounting bar, a quick connector is fixed on a node panel, a hose is connected to the quick connector and the flow allocation unit, and cabling is performed on the left side of the cabinet. Second, a flow allocation unit is securely installed on two internal sides of a column of a front door of a cabinet, a quick connector is installed on the flow allocation unit, and some cabling space is occupied. Advantages of the foregoing two solutions are a small change of a rack structure and good rack universality. However, there are also obvious limitations. In the first solution, space from a front panel to the door of the cabinet needs to be occupied, and space in a cabinet width direction is occupied, which limits the width of a subrack and leads to low space utilization. In the second solution, space from the front panel to the door of the cabinet needs to be occupied, which easily affects closing of the cabinet, and is not suitable for a front-access-cabled device with a large amount of front cabling, and moreover, cabling is performed together on cables and water pipes, leading to a large risk.

SUMMARY

The present disclosure provides a cabinet liquid cooling system and a cabinet, which are configured to implement functions that a liquid cooling device does not occupy space from an electronic device to a door of the cabinet, the front-access-cabled electronic device has cabling space, a risk of cabling cables and water pipes together is avoided, and a quick connector is convenient to operate and maintain.

According to one aspect, a cabinet liquid cooling system is provided, and is configured to dissipate heat of a cabinet, where the cabinet liquid cooling system includes a flow allocation unit, where the flow allocation unit is installed on a side wall of the cabinet, is located in space between the side wall of the cabinet and a mounting bar of the cabinet, and is configured to deliver and recycle liquid, and the flow allocation unit is provided with a liquid inlet and a liquid outlet; a liquid cooling system (LCS) control unit, where the LCS control unit is installed at the bottom of the cabinet, and cyclically supplies liquid to the flow allocation unit using the liquid inlet and the liquid outlet; multiple liquid supply branches in a one-to-one correspondence to multiple device handle bars, where each of the liquid supply branches supplies cooling liquid to an electronic device disposed in the device handle bar, and each of the liquid supply branches includes a liquid delivery pipe and a liquid return pipe that communicate with the flow allocation unit; multiple node pipes in a one-to-one correspondence to the multiple liquid supply branches, where each of the node pipes includes a liquid inlet pipe and a liquid outlet pipe; and multiple pairs of quick female connectors and quick male connectors that cooperate with each other, where the liquid inlet pipe of each of the node pipes is connected to the liquid delivery pipe of the corresponding liquid supply branch using the quick male connector and the quick female connector, and the liquid outlet pipe of each of the node pipes is connected to the liquid return pipe of the corresponding liquid supply branch using the quick male connector and the quick female connector; and the cooling liquid enters the flow allocation unit from the liquid inlet under control of the LCS control unit, enters the interior of the corresponding device handle bar to perform heat dissipation by successively passing through the liquid delivery pipe and the liquid inlet pipe, and then flows back to the flow allocation unit by successively passing through the liquid outlet pipe and the liquid return pipe.

In a first possible implementation manner, the flow allocation unit includes at least one liquid inlet unit for collecting liquid and at least one liquid outlet unit, the liquid outlet unit and the liquid inlet unit are isolated from each other and are configured to deliver liquid, the liquid inlet unit and the liquid outlet unit are both installed on a same side of the cabinet or are separately installed on two sides of the cabinet, and are located in the space between the side wall of the cabinet and the mounting bar of the cabinet, the liquid inlet is provided at the bottom or in the middle of the liquid inlet unit, the liquid outlet is provided at the bottom or in the middle of the liquid outlet unit, the liquid delivery pipe communicates with the liquid inlet unit, and the liquid return pipe communicates with the liquid outlet unit.

In a second possible implementation manner, one end of either of the liquid delivery pipe and the liquid return pipe is connected to the quick female connector, and the other end communicates with the flow allocation unit.

In a third possible implementation manner, one end of either of the liquid inlet pipe and the liquid outlet pipe is connected to the quick male connector, and the other end is connected to the corresponding device handle bar.

With reference to the third possible implementation manner, in a fourth possible implementation manner, the liquid inlet pipe and the liquid outlet pipe are connected to connector threads on a panel of the corresponding device handle bar using threaded connectors.

In a fifth possible implementation manner, the quick female connector and the quick male connector are mutually suspended and inserted for cooperation, and are fastened using a slidable sleeve; the slidable sleeve, the quick female connector, and the quick male connector are coaxial, and the slidable sleeve is axially movable.

With reference to the fifth possible implementation manner, in a sixth possible implementation manner, the quick female connector and the slidable sleeve are clamped and secured using a mounting bracket, the mounting bracket is formed by butting a lower mounting bracket and an upper mounting bracket that have a same structure, is locked using a screw or a bolt and a tapped hole that is provided on the mounting bracket, and is then securely installed on an inner side of the side wall of the cabinet using a screw or a bolt.

With reference to the sixth possible implementation manner, in a seventh possible implementation manner, both the lower mounting bracket and the upper mounting bracket are internally provided with accommodating space for disposing the quick female connector and the slidable sleeve and holes that are provided on two sides of the accommodating space and lead to the accommodating space, and a shape and a structure of the accommodating space match shapes of the quick female connector and the slidable sleeve.

With reference to the seventh possible implementation manner, in an eighth possible implementation manner, a size of the hole is less than a size of a cross section of either of the quick female connector and the slidable sleeve.

With reference to the sixth possible implementation manner, in a ninth possible implementation manner, both the lower mounting bracket and the upper mounting bracket are only internally provided with accommodating space for disposing the quick female connector and holes that are provided on two sides of the accommodating space and lead to the accommodating space, and a shape and a structure of the accommodating space match a shape of the quick female connector.

With reference to the ninth possible implementation manner, in a tenth possible implementation manner, the mounting bracket further includes a spring plate and a button ejector pin, and the slidable sleeve is provided with a groove portion; the spring plate is of an arch-shaped structure, has a middle portion and two bending portions connected to two edges of the middle portion, the middle portion is provided with a long-strip-shaped hole, and one of the bending portions is provided with an arc-shaped hole that cooperates with the quick male connector and is connected to the long-strip-shaped hole; the bending portion provided with the arc-shaped hole abuts the groove portion of the slidable sleeve, and the other bending portion is secured to the lower mounting bracket; the button ejector pin is provided with a bending section and an ejector pin section, the bending section is secured to the bending portion that is in the spring plate and is provided with the arc-shaped hole, and the ejector pin section is far away from the spring plate.

With reference to the ninth possible implementation manner, in an eleventh possible implementation manner, a size of the hole is less than a size of a cross section of the quick female connector.

In a twelfth possible implementation manner, the liquid delivery pipe, the liquid return pipe, the liquid inlet pipe, and the liquid outlet pipe are all hoses.

In a thirteenth possible implementation manner, the device handle bar is internally provided with a closed pipeline circulation system for the cooling liquid to flow.

According to another aspect, a cabinet is provided, where multiple device handle bars are disposed in the cabinet, and an electronic device is disposed in each of the device handle bars, where the cabinet has the cabinet liquid cooling system according to any one of the foregoing possible implementation manners.

According to the cabinet liquid cooling system of the present disclosure, a flow allocation unit is installed in a cabinet, and is located in space between a side wall of the cabinet and a mounting bar of the cabinet, which therefore determines a manner of disposing a liquid supply branch and a node pipe, and further determines that a quick female connector and a quick male connector can be suspended and butted for cooperation. That is, a function that space from an electronic device to a door of the cabinet is not occupied can be effectively implemented using the flow allocation unit that is securely installed on a single side of the cabinet and is located in the space between the side wall of the cabinet and the mounting bar of the cabinet to cooperate with multiple liquid supply branches, multiple node pipes, and multiple pairs of quick female connectors and quick male connectors that cooperate with each other.

Moreover, the quick female connector and the quick male connector are suspended and butted for cooperation, which does not occupy space between a front panel of the device and the door of the cabinet and cabling space, can effectively ensure that the front-access-cabled electronic device has sufficient cabling space, can further avoid a risk of cabling cables and water pipes together, and is convenient to operate and maintain a quick connector.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
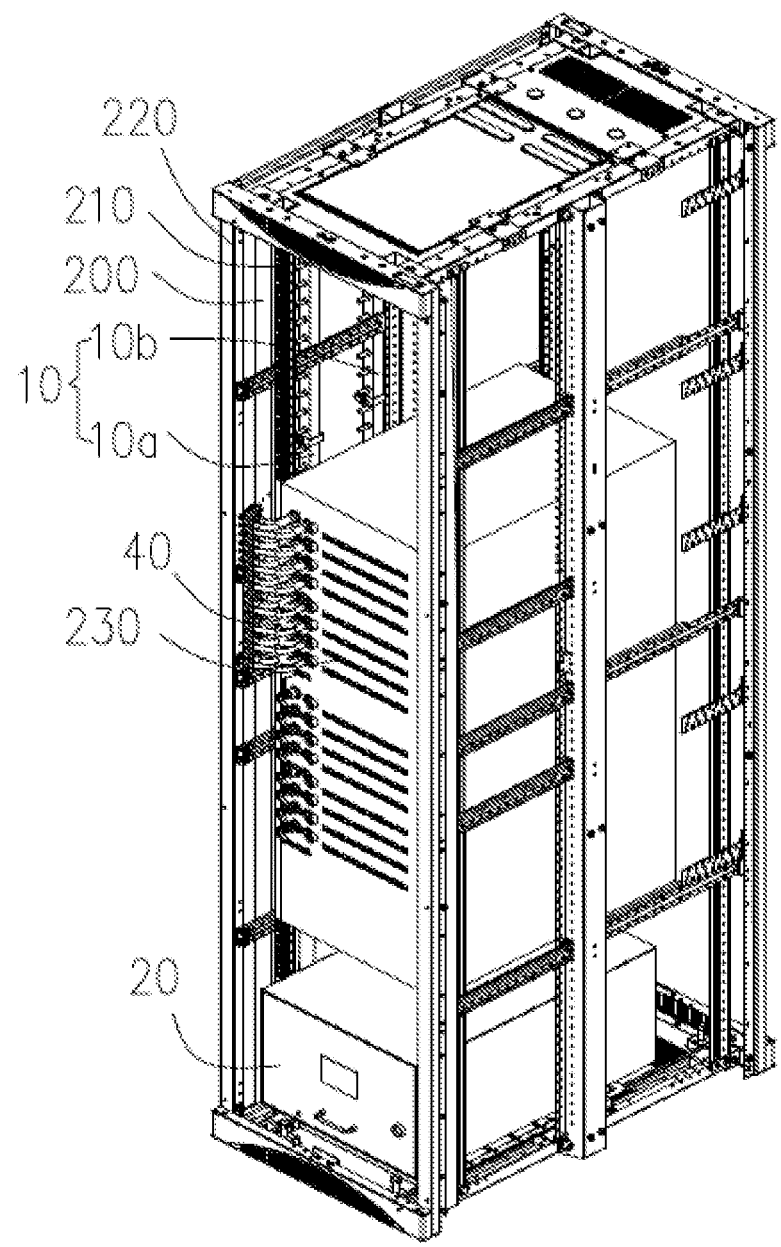
FIG. 1 is a schematic diagram of a cabinet having a cabinet liquid cooling system according to an embodiment of the present disclosure.
Figure 2:
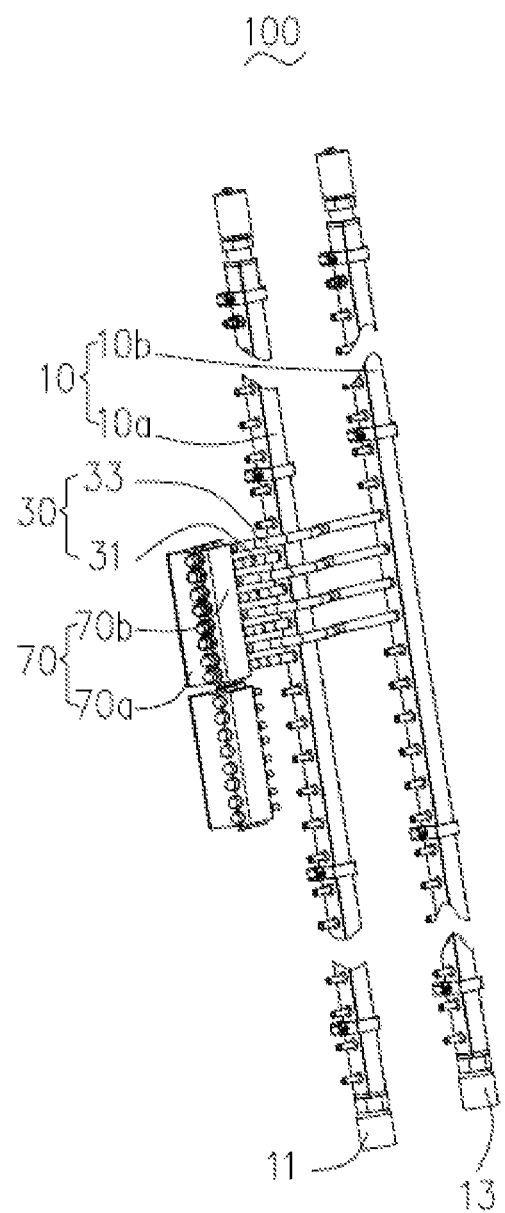
FIG. 2 is a schematic diagram of the cabinet liquid cooling system shown in FIG. 1.
Figure 3:
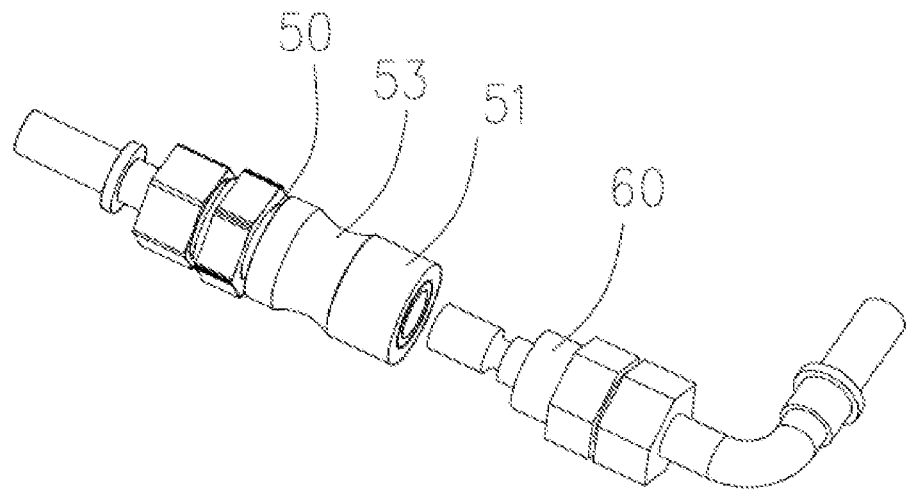
FIG. 3 is a schematic diagram of a quick female connector and a quick male connector that are in the cabinet liquid cooling system shown in FIG. 1.

Referring to FIG. 1 to FIG. 3 together, an embodiment of the present disclosure provides a cabinet liquid cooling system 100, where the cabinet liquid cooling system 100 is configured to dissipate heat of a cabinet 200, and the cabinet liquid cooling system 100 includes a flow allocation unit 10, an LCS control unit 20, multiple liquid supply branches 30, multiple node pipes 40, and multiple pairs of quick female connectors 50 and quick male connectors 60 that cooperate with each other.

The flow allocation unit 10 is securely installed on a side wall of the cabinet 200, and is located in space between the side wall of the cabinet and a mounting bar of the cabinet, and the flow allocation unit 10 has a liquid inlet 11 and a liquid outlet 13.

The LCS control unit 20 is installed at the bottom of the cabinet 200, and cyclically supplies liquid to the flow allocation unit 10 using the liquid inlet 11 and the liquid outlet 13.

The multiple liquid supply branches 30 are in a one-to-one correspondence to multiple device handle bars 230 that are disposed in the cabinet 200, a corresponding electronic device is disposed in the device handle bar, each of the liquid supply branches 30 supplies cooling liquid to the electronic device disposed in the device handle bar, and each of the liquid supply branches 30 includes a liquid delivery pipe 31 and a liquid return pipe 33.

The multiple node pipes 40 are in a one-to-one correspondence to the liquid supply branches 30, that is, in a one-to-one correspondence to the multiple device handle bars 230 disposed in the cabinet 200, and each of the node pipes 40 includes a liquid inlet pipe and a liquid outlet pipe.

The liquid inlet pipe of each of the node pipes 40 is connected to the liquid delivery pipe 31 of the corresponding liquid supply branch 30 using one of the quick male connectors 60 and one of the quick female connectors 50, and the liquid outlet pipe of each of the node pipes 40 is connected to the liquid return pipe 33 of the corresponding liquid supply branch 30 using one of the quick male connectors 60 and one of the quick female connectors 50.

The cooling liquid enters the flow allocation unit 10 from the liquid inlet 11 under control of the LCS control unit 20, enters the interior of the corresponding device handle bar to perform heat dissipation by successively passing through the liquid delivery pipe 31 and the liquid inlet pipe, and then flows back to the flow allocation unit 10 by successively passing through the liquid outlet pipe and the liquid return pipe 33.

It may be understood that the cooling liquid may be water, oil, or mixed liquid.

Referring to FIG. 1, the cabinet liquid cooling system 100 provided in this embodiment is described below in detail with reference to the cabinet 200.

The cabinet 200 includes a side wall 210 of the cabinet, a mounting bar 220 of the cabinet, and multiple device handle bars 230 disposed in the cabinet 200.

The flow allocation unit 10 is securely installed on the left side of the cabinet 200 (in a direction shown in FIG. 2). In this embodiment, the flow allocation unit 10 includes a liquid inlet unit 10a for collecting liquid and a liquid outlet unit 10b, the liquid outlet unit 10b and the liquid inlet unit 10a are isolated from each other and are configured to deliver liquid, and the liquid inlet unit 10a and the liquid outlet unit 10b are installed in parallel on the left side of the cabinet 200, are located in space between the side wall 210 of the cabinet and the mounting bar 220 of the cabinet, and are configured to deliver and recycle liquid; the liquid inlet 11 is provided at the bottom of the liquid inlet unit 10a, and the liquid outlet unit is provided at the bottom of the liquid outlet unit 10b.

It may be understood that a composition manner and a disposing manner of the flow allocation unit 10 are not limited thereto. The liquid inlet unit 10a and the liquid outlet unit 10b may also be installed on the right side of the cabinet 200, or the liquid inlet unit 10a and the liquid outlet unit 10b are respectively installed on the left side and the right side of the cabinet 200. Moreover, the flow allocation unit 10 may also include two liquid inlet units 10a and two liquid outlet units 10b. In addition, the liquid inlet 11 may be provided in the middle of the liquid inlet unit 10a, and the liquid outlet unit may also be provided in the middle of the liquid outlet unit 10b.

The LCS control unit 20 is installed at the bottom of the cabinet 200, is connected to the liquid inlet 11 and the liquid outlet 13 of the flow allocation unit 10, and cyclically supplies liquid to the flow allocation unit 10 using the liquid inlet 11 and the liquid outlet 13.

Also referring to FIG. 2, the multiple liquid supply branches 30 are separately configured to cyclically supply liquid to the multiple device handle bars 230 disposed in the cabinet 200. The liquid delivery pipe 31 is connected to the liquid inlet unit 10a, and the liquid return pipe 33 is connected to the liquid outlet unit 10b. Also referring to FIG. 3, in this embodiment, one end of the liquid delivery pipe 31 is connected to one quick female connector 50, the other end is connected to a corresponding interface (not shown) of the liquid inlet unit 10a in the flow allocation unit 10, one end of the liquid return pipe 33 is connected to one quick female connector 50, and the other end is connected to a corresponding interface (not shown) of the liquid outlet unit 10b in the flow allocation unit 10.

Exemplarily, the liquid delivery pipe 31 and the liquid return pipe 33 are both hoses.

It may be understood that the device handle bar 230 can form a circulation cooling pipeline together with the flow allocation unit 10 using the liquid delivery pipe 31, one of the quick female connectors 50, one of the quick male connectors 60 and the liquid inlet pipe; and the liquid outlet pipe, one of the quick male connectors 60, one of the quick female connectors 50, and the liquid return pipe 33, so as to perform cooling and heat dissipation on the electronic device disposed in the device handle bar 230.

In this embodiment, the liquid inlet pipe and the liquid outlet pipe are both connected to connector threads (not shown) on a panel of the corresponding device handle bar 230 using threaded connectors (not shown), thereby implementing connection between the liquid inlet pipe and the corresponding device handle bar 230 and connection between the liquid outlet pipe and the corresponding device handle bar 230.

Exemplarily, the liquid inlet pipe and the liquid outlet pipe are both hoses.

In this embodiment, a closed pipeline circulation system inside the device handle bar 230 is similar to a water tank, and is not limited to this embodiment. A different water path structure may also be designed according to an actual structure of the device handle bar 230.

The quick female connector 50 and the quick male connector 60 are mutually suspended and inserted for cooperation, and are fastened using a slidable sleeve 51, which are shown in FIG. 3; the slidable sleeve 51, the quick female connector 50, and the quick male connector 60 are coaxial, and the slidable sleeve 51 is axially movable. In this embodiment, a groove portion 53 is disposed on an external surface of the slidable sleeve 51.

The multiple quick female connectors 50 are clamped and secured using a mounting bracket 70, are locked using a screw or a bolt (not shown) and a tapped hole 71 provided on the mounting bracket 70, and are then all securely installed on an inner side of the side wall 210 of the cabinet using a screw or a bolt (not shown). In this embodiment, the mounting bracket 70 is formed by butting a lower mounting bracket 70a and an upper mounting bracket 70b that have a same structure. That is, the multiple quick female connectors 50 are clamped and secured by butting the lower mounting bracket 70a and the upper mounting bracket 70b, are locked using the screw and the tapped hole 71, and are then all securely installed on the inner side of the side wall 210 of the cabinet using the screw.

In this embodiment, the structure of the mounting bracket 70 includes the following two different implementation manners.

Figure 4:
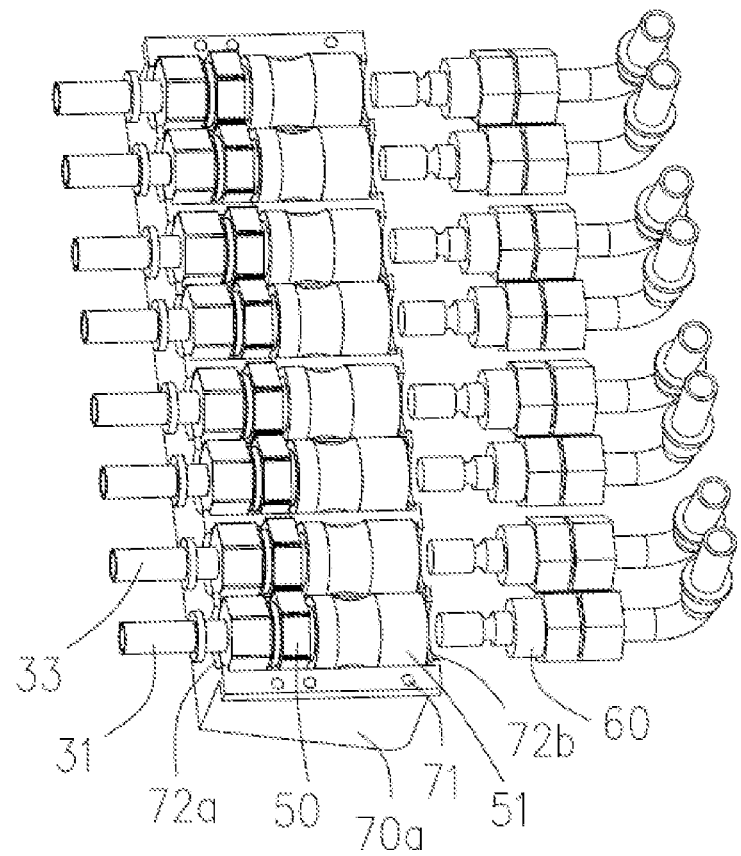
FIG. 4 is a schematic structural diagram of a mounting bracket in the cabinet liquid cooling system shown in FIG. 1.

First, as shown in FIG. 4, both the lower mounting bracket 70a and the upper mounting bracket 70b are internally provided with accommodating space (not shown) for disposing the quick female connector 50 and the slidable sleeve 51 and semicircular holes 72a and 72b that are provided on two sides of the accommodating space and lead to the accommodating space, and a shape and a structure of the accommodating space correspond to shapes and structures of the quick female connector 50 and the slidable sleeve 51. That is, the shape and the structure of the accommodating space match the shapes of the quick female connector 50 and the slidable sleeve 51. Further, a structure of the lower mounting bracket 70a is the same as a structure of the upper mounting bracket 70b, the interiors of the lower mounting bracket 70a and the upper mounting bracket 70b are hollow structures, and two ends are separately provided with the semicircular holes 72a and 72b leading to the interiors. The lower mounting bracket 70a and the upper mounting bracket 70b are mutually butted, to form an accommodating portion (not shown) for accommodating the quick female connector 50 and the slidable sleeve 51. In this embodiment, the diameters of the semicircular holes 72a and 72b are less than a size of a cross section of either of the quick female connector 50 and the slidable sleeve 51, which therefore can prevent the quick female connector 50 and the slidable sleeve 51 that are accommodated in the accommodating portion from being detached from the accommodating portion from the semicircular holes 72a and 72b.

When the quick female connector 50 and the quick male connector 60 are connected, the quick male connector 60 is inserted into the quick female connector 50, and when a side wall corresponding to the semicircular hole 72a withstands the quick female connector 50, the quick male connector 60 can be smoothly inserted. When the quick female connector 50 and the quick male connector 60 are detached, a drawing force is exerted on the quick male connector 60, and the quick male connector 60 and the quick female connector 50 that are connected move towards one side of the semicircular hole 72b by a distance. When the slidable sleeve 51 is in contact with the side wall of the semicircular hole 72b, a leftward reactive force (in a location direction in FIG. 3) of the lower mounting bracket 70a and the upper mounting bracket 70b is exerted on the slidable sleeve 51, and therefore, the quick male connector 60 can be pulled out.

In this embodiment, the cross section of the quick female connector 50 is hexagonal, the whole slidable sleeve 51 is of a cylinder structure, and the size of the cross section of the quick female connector 50 is greater than a transversal size of the slidable sleeve 51. Correspondingly, internal space of either of the lower mounting bracket 70a and the upper mounting bracket 70b is provided with two-section-type accommodating space, where shapes of cross sections of the two sections are trapezoidal and semicircular. Therefore, after the two-section-type accommodating space of the lower mounting bracket 70a and the two-section-type accommodating space of the upper mounting bracket 70b are butted, space for accommodating the quick female connector 50 and the slidable sleeve 51 can be formed, that is, the accommodating portion. It may be understood that a size of a cross section of the quick female connector 50 corresponding to the accommodating portion is greater than the size of the cross section of the slidable sleeve 51.

It may be understood that the two sides of the accommodating space may also be provided with holes of other shapes, which are not limited to the semicircular holes in this embodiment.

Figure 5:
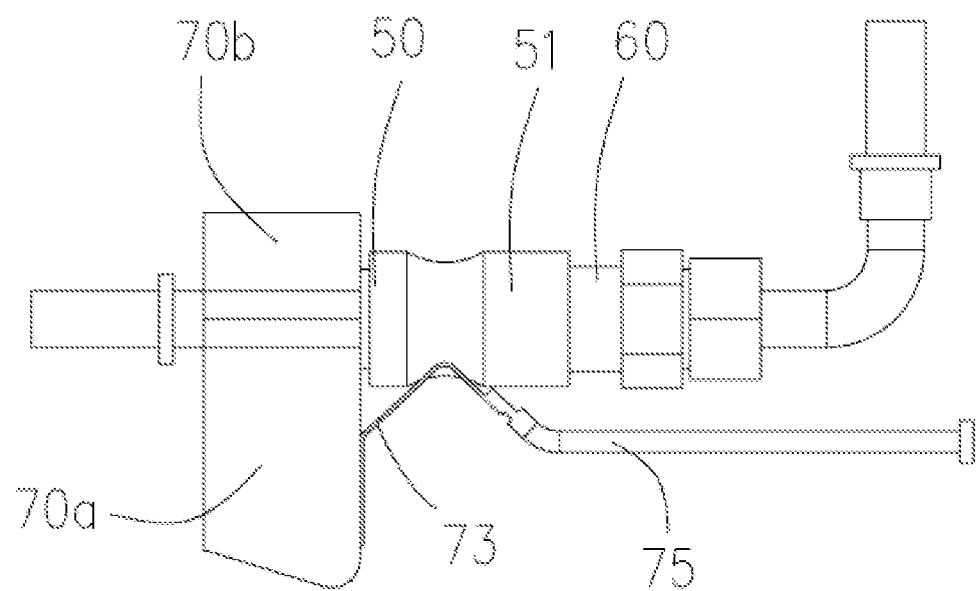
FIG. 5 is another schematic structural diagram of a mounting bracket in the cabinet liquid cooling system shown in FIG. 1.
Figure 6:
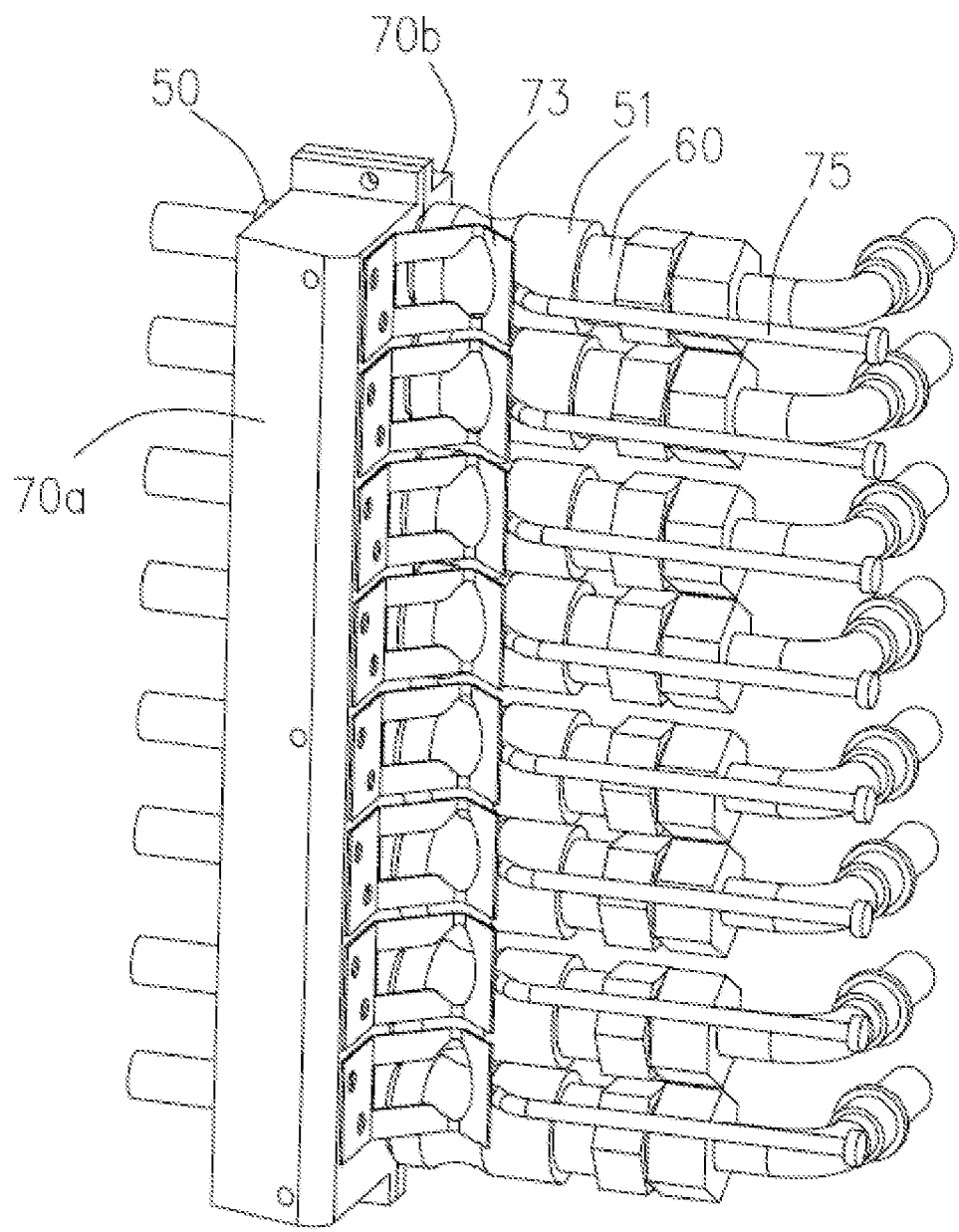
FIG. 6 is a schematic diagram of the mounting bracket shown in FIG. 5 in another view angle.

Second, as shown in FIG. 5 and FIG. 6, both the lower mounting bracket 70a and the upper mounting bracket 70b are only internally provided with accommodating space (not shown) for disposing the quick female connector 50 and semicircular holes (not shown) that are provided on the two sides of the accommodating space and lead to the accommodating space, and the shape and the structure of the accommodating space correspond to the shape and the structure of the quick female connector 50. That is, the shape and the structure of the accommodating space match the shape of the quick female connector 50. In this embodiment, the cross section of the quick female connector 50 is hexagonal. Correspondingly, internal space of either of the lower mounting bracket 70a and the upper mounting bracket 70b is provided with accommodating space, the shape of the cross section of which is trapezoidal. Therefore, after the accommodating space of the lower mounting bracket 70a and the accommodating space of the upper mounting bracket 70b are butted, an accommodating portion for accommodating the quick female connector 50 can be formed.

In this embodiment, the diameter of the semicircular hole is less than a size of a cross section of the quick female connector.

The mounting bracket 70 further includes a spring plate 73 and a button ejector pin 75. The spring plate 73 is of an arch-shaped structure, and has a middle portion and two bending portions connected to two edges of the middle portion, the middle portion is provided with a long-strip-shaped hole, and one of the bending portions is provided with an arc-shaped hole that cooperates with the quick male connector 60 and is connected to the long-strip-shaped hole. Therefore, the spring plate 73 forms a hollow-out structure, and when the quick male connector 60 is inserted into the quick female connector 50, the insertion is not interfered with by the spring plate 73. The bending portion provided with the arc-shaped hole abuts the groove portion 53 of the slidable sleeve 51, and the other bending portion is secured to the lower mounting bracket 70a. The button ejector pin 75 has a bending section and an ejector pin section, the bending section is disposed at the bending portion, which is provided with the arc-shaped hole, in the spring plate 73, and the ejector pin section is far away from the spring plate 73.

When the quick male connector 60 and the quick female connector 50 are detached, the ejector pin section of the button ejector pin 75 is pressed to the left first, the spring plate 73 is forced to deform using the bending section of the button ejector pin 75 and the slidable sleeve 51 is pushed to move to the left by a distance, and then the quick male connector 60 can be smoothly pulled out. In this embodiment, the button ejector pin 75 is secured to a second end of the spring plate 73.

Water of the cabinet liquid cooling system 100 flows out of the LCS control unit 20, and enters the liquid inlet unit 10a by passing through the liquid inlet 11 of the flow allocation unit 10; then, flows into the quick female connector 50 and the quick male connector 60 by passing through the liquid delivery pipe 31 of the liquid supply branch 30; and then, enters the interior of the device handle bar 230 by passing through the liquid inlet pipe of the node pipe 40; after flowing by a circle in the device handle bar 230, the cooling water flows out of the liquid outlet pipe of the node pipe 40, flows to the liquid return pipe 33 by passing through the quick male connector 60 and the quick female connector 50, and enters the liquid outlet unit 10b of the flow allocation unit 10; and eventually, flows back to the LCS control unit 20 by passing through the liquid outlet 13. Therefore, a closed cooling water circulation is formed.

According to the cabinet liquid cooling system 100 of the present disclosure, the flow allocation unit 10 is installed in a cabinet 200, and is located in space between a side wall of the cabinet 200 and a mounting bar of the cabinet 200, which therefore determines a manner of disposing a liquid supply branch 30 and a node pipe 40, and further determines that a quick female connector 50 and a quick male connector 60 can be suspended and butted for cooperation. That is, a function that space from an electronic device to a door of the cabinet 200 and cabling space are not occupied can be effectively implemented using the flow allocation unit 10 that is securely installed on a single side of the cabinet 200 and is located in the space between the side wall of the cabinet 200 and the mounting bar of the cabinet 200 to cooperate with multiple liquid supply branches 30, multiple node pipes 40, and multiple pairs of quick female connectors 50 and quick male connectors 60 that cooperate with each other.

Moreover, the quick female connector 50 and the quick male connector 60 are suspended and butted for cooperation, which does not occupy the space between a front panel of a device and the door of the cabinet and the cabling space, can effectively ensure that the front-access-cabled electronic device has sufficient cabling space, can further avoid a risk of cabling cables and water pipes together, and is convenient to operate and maintain a quick connector.

In addition, the flow allocation unit 10 is installed between the side wall of the cabinet and the mounting bar of the cabinet, and is hidden well, thereby facilitating implementation of a function of smooth switching between an air cooling cabinet and a liquid cooling cabinet.

In addition, cooperation and detachment of the quick female connector 50 and the quick male connector 60 can be quickly and conveniently implemented in the two different implementation manners of the mounting bracket 70, which is convenient to operate and maintain.

What is disclosed above is merely embodiments of the present disclosure, and is not intended to limit the protection scope of the present disclosure. Therefore, equivalent variations made in accordance with the claims of the present disclosure shall fall within the scope of the present disclosure.

The invention claimed is:

1. A cabinet liquid cooling system configured to dissipate heat of a cabinet, the cabinet liquid cooling system comprising:
   a flow allocator installed on a side wall of the cabinet and that is located in space between the side wall of the cabinet and a mounting bar of the cabinet, the flow allocator being provided with a liquid inlet and a liquid outlet, the liquid inlet being provided at a liquid inlet unit of the flow allocator, and the liquid outlet being provided at a liquid outlet unit of the flow allocator;
   multiple liquid supply branches in a one-to-one correspondence to multiple device handle bars, multiple electronic devices in a one-to-one correspondence to the multiple device handle bars, each of the liquid supply branches passing one of the electronic devices behind the corresponding device handle bar, each of the liquid supply branches comprising a liquid delivery pipe and a liquid return pipe that communicate with the flow allocator, and each of the liquid delivery pipes having a length that is less than a length of each of the liquid return pipes;
   multiple pairs of quick female connectors and quick male connectors that cooperate with each other; and
   multiple node pipes in a one-to-one correspondence to the multiple liquid supply branches, each of the node pipes comprising a liquid inlet pipe and a liquid outlet pipe, the liquid inlet pipe of each of the node pipes being coupled to the liquid delivery pipe of the corresponding liquid supply branch using one of the pairs of quick female connectors and quick male connectors, and the liquid outlet pipe of each of the node pipes being coupled to the liquid return pipe of the corresponding liquid supply branch using the one of the pairs of quick female connectors and quick male connectors.

2. The cabinet liquid cooling system of claim 1, wherein the liquid inlet unit and the liquid outlet unit are both installed on a same side of the cabinet or are separately installed on two sides of the cabinet, and are located in the space between the side wall of the cabinet and the mounting bar of the cabinet, the liquid inlet is provided at the bottom or in the middle of the liquid inlet unit, the liquid outlet is provided at the bottom or in the middle of the liquid outlet unit, the liquid delivery pipe is coupled to the liquid inlet unit, and the liquid return pipe is coupled to the liquid outlet unit.

3. The cabinet liquid cooling system of claim 1, wherein the system further comprises a liquid that is configured to enter the liquid inlet unit of the flow allocator through the liquid inlet, pass through one of the liquid delivery pipes to one of the node pipes, pass through the one of the node pipes to one of the liquid return pipes and then to the liquid outlet unit of the flow allocator, and exit the liquid outlet unit of the flow allocator through the liquid outlet.

4. The cabinet liquid cooling system of claim 1, wherein the system further comprises a mounting bracket that supports the multiple node pipes, the liquid inlet unit of the flow allocator being positioned between the mounting bracket and the liquid outlet unit of the flow allocator.

5. The cabinet liquid cooling system of claim 4, wherein the quick female connector and the quick male connector are mutually suspended and inserted for cooperation, and are fastened by using a slidable sleeve; the slidable sleeve, the quick female connector, and the quick male connector are coaxial, and the slidable sleeve is axially movable.

6. The cabinet liquid cooling system of claim 5, wherein the quick female connector and the slidable sleeve are clamped and secured by using the mounting bracket, the mounting bracket is formed by butting a lower mounting bracket and an upper mounting bracket that have a same structure, is locked by using a screw or a bolt and a tapped hole that is provided on the mounting bracket, and is then securely installed on an inner side of the side wall of the cabinet by using a screw or a bolt.

7. The cabinet liquid cooling system of claim 6, wherein both the lower mounting bracket and the upper mounting bracket are internally provided with accommodating space for disposing the quick female connector and the slidable sleeve and holes that are provided on two sides of the accommodating space and lead to the accommodating space, and a shape and a structure of the accommodating space match shapes of the quick female connector and the slidable sleeve.

8. The cabinet liquid cooling system of claim 7, wherein a size of the hole is less than a size of a cross section of either of the quick female connector and the slidable sleeve.

9. The cabinet liquid cooling system of claim 6, wherein both the lower mounting bracket and the upper mounting bracket are only internally provided with accommodating space for disposing the quick female connector and holes that are provided on two sides of the accommodating space and lead to the accommodating space, and a shape and a structure of the accommodating space match a shape of the quick female connector.

10. The cabinet liquid cooling system of claim 9, wherein the mounting bracket further comprises a spring plate and a button ejector pin, and the slidable sleeve is provided with a groove portion; the spring plate is of an arch-shaped structure, has a middle portion and two bending portions connected to two edges of the middle portion, the middle portion is provided with a long-strip-shaped hole, and one of the bending portions is provided with an arc-shaped hole that cooperates with the quick male connector and is connected to the long-strip-shaped hole; the bending portion provided with the arc-shaped hole abuts the groove portion of the slidable sleeve, and the other bending portion is secured to the lower mounting bracket; the button ejector pin is provided with a bending section and an ejector pin section, the bending section is secured to the bending portion that is in the spring plate and is provided with the arc-shaped hole, and the ejector pin section is far away from the spring plate.

11. The cabinet liquid cooling system of claim 9, wherein a size of the hole is less than a size of a cross section of the quick female connector.

12. The cabinet liquid cooling system of claim 1, wherein the liquid delivery pipe, the liquid return pipe, the liquid inlet pipe, and the liquid outlet pipe are all hoses.

13. The cabinet liquid cooling system of claim 1, wherein each of the electronic devices is provided with a closed pipeline circulation system for a liquid to flow.

14. A cabinet comprising multiple electronic devices disposed in the cabinet, the cabinet having a cabinet liquid cooling system, the cabinet liquid cooling system supplying liquid for heat dissipation to the multiple electronic devices, and the cabinet liquid cooling system comprising:
a flow allocator installed on a side wall of the cabinet and that is located in space between the side wall of the cabinet and a mounting bar of the cabinet, the flow allocator being provided with a liquid inlet and a liquid outlet, the liquid inlet being provided at a liquid inlet unit of the flow allocator, and the liquid outlet being provided at a liquid outlet unit of the flow allocator;
multiple liquid supply branches in a one-to-one correspondence to multiple device handle bars, the multiple electronic devices in a one-to-one correspondence to the multiple device handle bars, each of the respective liquid supply branches passing the respective electronic device behind the respective device handle bar, each of the liquid supply branches comprising a liquid delivery pipe and a liquid return pipe that communicate with the flow allocator, and each of the liquid delivery pipes having a length that is less than a length of each of the liquid return pipes;
multiple pairs of quick female connectors and quick male connectors that cooperate with each other; and
multiple node pipes in a one-to-one correspondence to the multiple liquid supply branches, each of the node pipes comprising a liquid inlet pipe and a liquid outlet pipe, the liquid inlet pipe of each of the node pipes being coupled to the liquid delivery pipe of the corresponding liquid supply branch using one of the pairs of quick female connectors and quick male connectors, and the liquid outlet pipe of each of the node pipes being coupled to the liquid return pipe of the corresponding liquid supply branch using the one of the pairs of quick female connectors and quick male connectors.

* * * * *